United States Patent [19]

Sakino et al.

[11] Patent Number: 5,040,431
[45] Date of Patent: Aug. 20, 1991

[54] MOVEMENT GUIDING MECHANISM

[75] Inventors: Shigeo Sakino; Eiji Osanai; Mahito Negishi, all of Yokohama; Michio Horikoshi, Ushiku; Mitsuru Inoue, Kawasaki; Kazuya Ono, Tokyo, all of Japan

[73] Assignee: Canon Kabushiki Kaisha, Tokyo, Japan

[21] Appl. No.: 299,340

[22] Filed: Jan. 23, 1989

[30] Foreign Application Priority Data

Jan. 22, 1988 [JP] Japan .................................. 63-12137
Apr. 11, 1988 [JP] Japan .................................. 63-87240

[51] Int. Cl.$^5$ .......................................... H01L 21/00
[52] U.S. Cl. ............................ 74/479; 108/143; 248/661; 248/913; 384/9; 384/12
[58] Field of Search ............... 74/479; 248/660, 61, 248/913; 108/20, 143; 384/9, 12

[56] References Cited

U.S. PATENT DOCUMENTS

| | | | |
|---|---|---|---|
| 4,409,860 | 10/1983 | Moriyama et al. | 74/479 |
| 4,615,515 | 10/1986 | Suzuta et al. | 269/73 |
| 4,648,723 | 3/1987 | Sugiyama et al. | 384/9 |
| 4,648,724 | 3/1987 | Sugiyama et al. | 384/9 |
| 4,653,408 | 3/1987 | Nagashima et al. | 108/143 |
| 4,744,675 | 5/1988 | Sakino et al. | 384/12 |

FOREIGN PATENT DOCUMENTS 60-140722 7/1985 Japan .
61-112216 5/1986 Japan .

Primary Examiner—Leslie A. Braun
Assistant Examiner—Scott Anchell
Attorney, Agent, or Firm—Fitzpatrick, Cella, Harper & Scinto

[57] ABSTRACT

In a movement guiding device, two parallel stationary guides are fixed to a surface plate and plural hydrostatic gas or bearing members are provided for the surface plate and the stationary guides. A Y stage is moved in a Y-axis direction under the influence of these bearing members. Additional hydrostatic gas or air bearing members are provided in relation to the surface plate and the Y stage so as to support an X stage for movement in an X-axis direction orthogonal to the Y-axis direction. Guide of the Y stage in the X-axis direction is made by the stationary guides on the surface plate, while guide thereof in a Z-axis direction perpendicular to an X-Y plane is made by the surface plate. Guide of the X stage in the Y-axis direction is made by the Y stage, while the guide thereof in the Z-axis direction is made by the surface plate, similar to the Y stage. With such structure, any vibration, rolling, or otherwise, of the Y stage is not transmitted to the X stage. Thus, high-precision guide is attainable. Linear motors are used as drive sources for the X and Y stages, so that all movable portions are provided by non-contact structures. Further, suitable brake members are used, which members are operable at a time of an accident of the stage. By this, accidental collision of the stage and/or derailment of the stage from the guide can be prevented.

12 Claims, 9 Drawing Sheets

MOVEMENT GUIDING MECHANISM

FIELD OF THE INVENTION AND RELATED ART

This invention relates to a movement guiding device and, more particularly, to a movement guiding device which is usable in, for example, a semiconductor device manufacturing apparatus or a high-precision machining tool, for moving and positioning a movable member such as, for example, an X-stage or a Y-stage, very quickly and with high precision.

Many proposals have been made for such a movement guiding device by which a movable member is moved along a predetermined guide and then is positioned at a predetermined site with high precision.

FIG. 15 is a perspective view showing a major portion of a known type movement guiding device which includes an X-Y moving mechanism. Denoted at 81 in this Figure is a surface plate on which a Y stage (Y-direction moving mechanism) 84 is placed. Disposed on this Y stage 84 is an X stage (X-direction moving mechanism) 85. Each of the X stage 85 and the Y stage 84 can be moved in a predetermined direction by a linear motor or otherwise (not shown) and is positioned at a desired site.

An example of a hydrostatically guided stage is illustrated in FIG. 16. In the structure as illustrated, a movable member 204 which is fixedly secured to four hydrostatic bearing mounting plates 202 can slide along guides 203. As a driving actuator, a ball-screw assembly 201 and a DC motor 200 are used.

Another example of a hydrostatically guided stage is disclosed in Japanese Laid-Open Patent Application, Laid-Open No. Sho 61-112216, which was laid open on May 30, 1986. In this example, for stoppage of movement of the stage, the supply of air pressure to a hydrostatic bearing means is stopped so that the stage is clamped to a surface plate.

SUMMARY OF THE INVENTION

The movement guiding device illustrated in FIG. 15 is of such an arrangement that the surface plate 81, the Y stage 84 and the X stage 85 are accumulated in a vertical (Z-axis) direction. As a result, the height of the device in the vertical direction (Z direction) cannot be made low. Also, when the X stage 85 moves in the X direction, an unbalanced load is applied to the Y stage 84 in accordance with the position of the X stage 85 in the X direction. As a result, the Y stage 84 deforms such as depicted by broken lines in FIGS. 17A and 17B, for example. This leads to deterioration of the static attitude precision of the X stage 85. Further, with this structure, any pitching of the Y stage 84, for example, results in the creation of rolling of the X stage 85, as illustrated in FIG. 18. Namely, the six freedoms of movement, as illustrated, are all interrelated and, therefore, the attitude precision is dynamically easily deteriorated.

It is accordingly an object of the present invention to provide a movement guiding device wherein, for movement of an X stage and a Y stage, the guide for each one of the X stage and the Y stage is suitably set, such that any moving load to the Y stage, for example, is avoided and disadvantageous deterioration of the static attitude precision of the X stage is prevented, whereby high-precision positioning is attainable.

It is another object of the present invention to provide a movement guiding device wherein transmission to an X stage of vibration with respect to three components (e.g. a direction perpendicular to the moving direction (Y direction) of a Y stage, a vertical direction and rolling of the Y stage) is completely intercepted, and wherein transmission to the X stage of any pitching of the Y stage is minimized by utilizing a gap or spacing of a hydrostatic air bearing means, whereby high-precision positioning is attainable.

In accordance with one aspect of the present invention, to achieve at least one of these objects, there is provided a movement guiding mechanism wherein two stationary guides are disposed on a surface plate so as to extend in parallel to each other; wherein a hydrostatic gas bearing means is provided to relatively support the stationary guides and a first movable member, such as a Y stage, and also to relatively support the first movable member and the surface plate in a manner such that the first movable member can move in a direction parallel to the stationary guides; wherein another hydrostatic gas bearing means is provided to relatively support the first movable member and a second movable member, such as an X stage, and also to relatively support the surface plate and the second movable member in a manner such that the second movable member can move in a direction (X direction) perpendicular to the moving direction (Y direction) of the first movable member; wherein the guiding of the first movable member in a lateral direction (X direction) is made by means of the two stationary guides provided on the surface plate while guiding of the same in a vertical direction (Z direction) is made by means of the surface plate; and wherein the guiding of the second movable member in a lateral direction (Y direction) is made by means of the first movable member while guiding of the same in a vertical direction (Z direction) is made by means of the surface plate.

On the other hand, in the example shown in FIG. 16, the position of the stage can be held fixed in a state in which the stage is not controlled. However, due to the friction existing within the system, there is a high possibility of notable deterioration of the attitude precision. Further, in the structure as disclosed in Japanese Laid-Open Patent Application, Laid Open No. Sho 61-112216, substantially no friction exists within the system. As a result, there is a possibility that, when the stage is not controlled or at a time of overrunning of the stage, the stage impinges against a stroke end and, for this reason, it is damaged. Additionally, the stoppage of air pressure to the hydrostatic bearing means results in the problem to damage of the bearing surface due to the contact thereof to a guide.

It is accordingly a further object of the present invention to provide a movement guiding device by which high-precision positioning and high-precision attitude control are attainable and by which damage of a stage or a hydrostatic bearing means due to accidental overrunning of the stage can be prevented.

In accordance with another aspect of the present invention, a movement guiding device includes a hydrostatically guided stage mechanism having a non-contact hydrostatic gas bearing means and a non-contact linear motor and, additionally, there are provided speed detecting means for detecting the moving speed of a movable member and brake means operable in accordance with the result of the detection by the speed detecting means to brake the movable member.

With this arrangement, the brake means can operate at a time of non-control of a stage (e.g. at the time of occurrence of an accident within the hydrostatically guided stage mechanism and during a stand-by state, waiting for supply of signals), whereby damage of the stage or a hydrostatic bearing means can be prevented.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
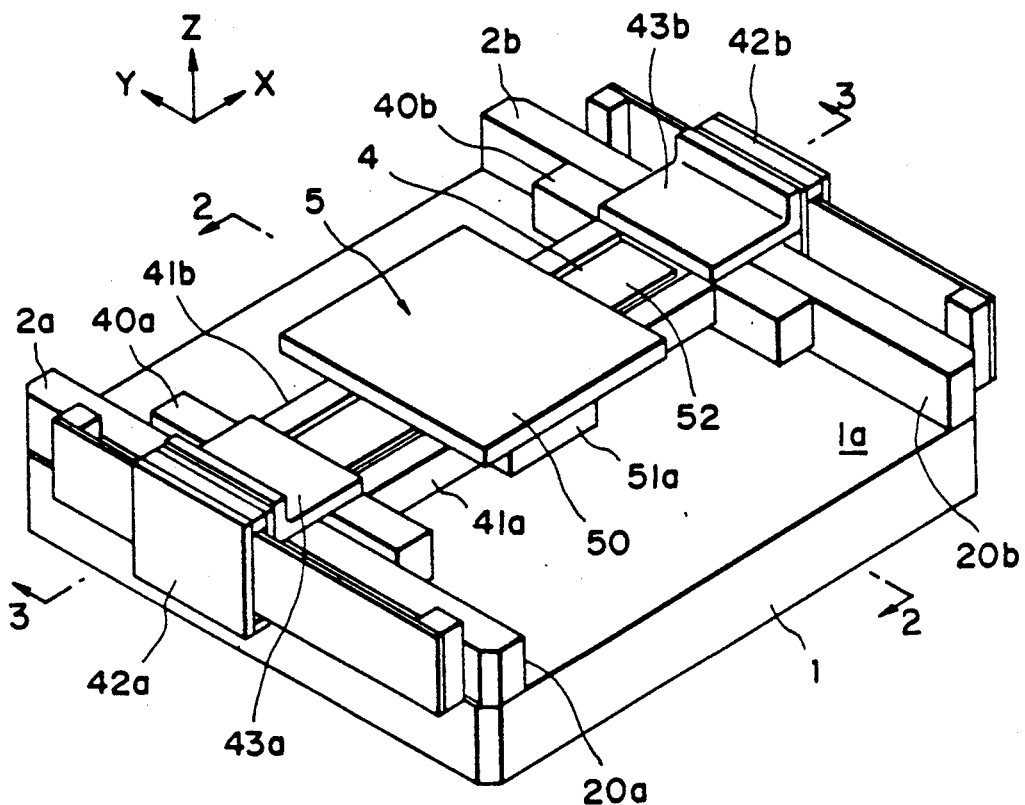
FIG. 1 is a perspective view schematically showing a movement guiding device according to an embodiment of the present invention.
Figure 3:
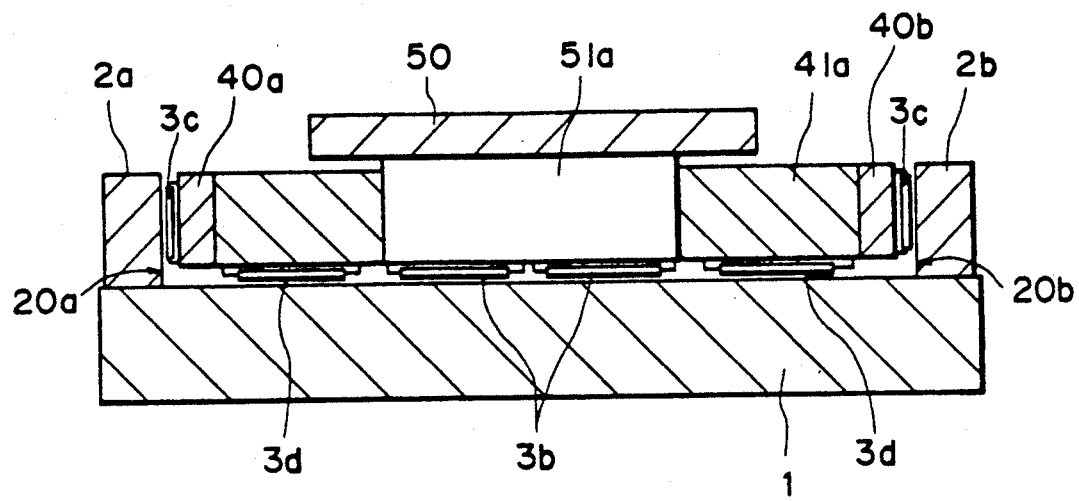
FIG. 3 is a section taken on a line 3—3, in FIG. 1.
Figure 4:
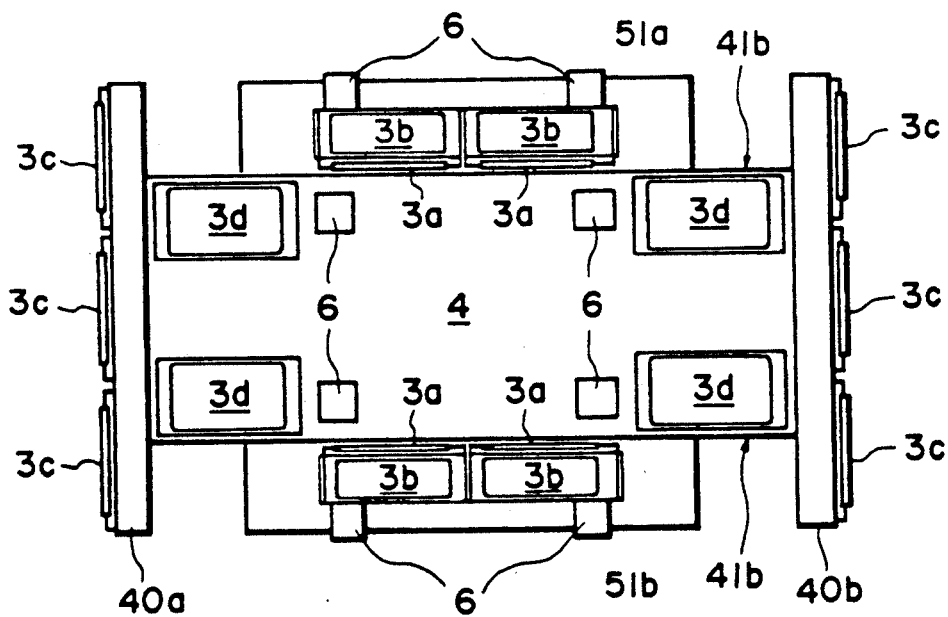
FIG. 4 is a bottom view of a stage mechanism included in the FIG. 1 embodiment.

Referring first to FIG. 1, there is shown a movement guiding device according to an embodiment of the present invention. In FIG. 1, denoted at 1 is a surface plate whose upper surface 1a provides a smooth reference surface. The device includes a Y stage (first movable member) 4, an X stage (second movable member) 5, and two stationary guides 2a and 2b. Opposing side surfaces 20a and 20b of these guides 2a and 2b function to guide the movement of the Y stage 4 in a Y-axis direction relative to the surface plate 1 and also to limit any displacement of the Y stage in an X-axis direction. These stationary guides are fixed on the upper surface of the surface plate 1 so as to extend in parallel to the Y-axis direction with a predetermined spacing in the X-axis direction defined between the guides. The Y stage 4 is placed on the upper surface 1a of the surface plate 1 so as to be sandwiched between the stationary guides 2a and 2b. To the opposite ends of the Y stage 4 in the X-axis direction, two hydrostatic gas or air bearing mounting plates 40a and 40b are fixed, respectively. As best seen in FIG. 4, each of the mounting plates 40a and 40b is provided with three hydrostatic gas or air bearing pads 3c which are fixed to the corresponding mounting plate. Also, as best seen in FIG. 3, the pads 3c of the mounting plate 40a are disposed to be opposed to the side surface 20a of the stationary guide 2a, while the pads 3c of the mounting plate 40b are disposed to be opposed to the side surface 20b of the stationary guide 2b. As best seen in FIG. 4, the bottom face of the Y stage 4 is provided with four hydrostatic gas or air bearing pads 3d which are fixed thereto at the four corners of the bottom face of the stage, respectively. As seen in FIG. 3, each pad 3d is disposed to be opposed to the upper face 1a of the surface plate 1.

Figure 2:
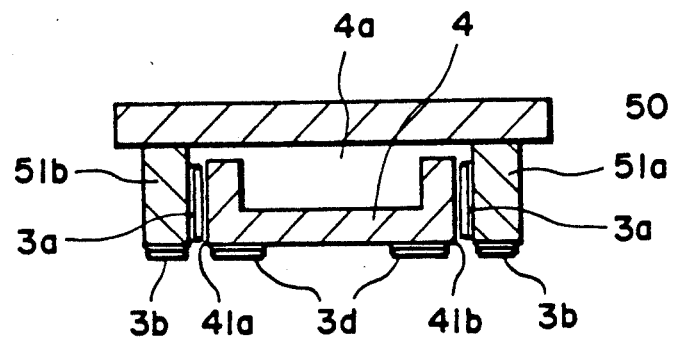
FIG. 2 is a section taken on a line 2—2, in FIG. 1.

The X stage 5 is placed on the surface plate 1 so as to straddle the Y stage 4. The X stage 5 has ends in the Y-axis direction to which two hydrostatic gas or air bearing mounting plates 51a and 51b are fixed, respectively. As best seen in FIG. 4, each of the mounting plates 51a and 51b is provided with two pairs of hydrostatic gas or air bearing pads 3a and 3b. As seen in FIG. 2, the pads 3a of the mounting plate 51a are opposed to a side surface 41b of the Y stage 4, which surface functions as a guide surface for the movement of the X stage 5 in the X-axis direction. On the other hand, the pads 3a of the mounting plate 51b are opposed to another side surface 41a of the Y stage 4, which surface similarly functions as a guide surface. The pads 3b mounted to the lower surfaces of the mounting plates 51a and 51b are opposed to the upper face 1a of the surface plate 1, as best seen in FIG. 3.

Each of these pads 3a, 3b, 3c and 3d is a hydrostatic gas or air bearing pad which can be made of a porous material, and each pad is supplied with a gas or air pressure from an unshown hydrostatic gas or air supply source, the supplied gas or air pressure being discharged toward a surface opposed to the pad. Thus, each pad constitutes a hydrostatic gas or air bearing member. The bearing pads 3a function as a guide for guiding the movement of the X stage 5 relative to the Y stage 4 in the X-axis direction. The bearing pads 3c function as a guide for guiding movement of the Y stage 4 relative to the surface plate 1 in the Y-axis direction. Also, the bearing pads 3b function to support the X stage 5 relative to the surface plate 1 in a Z-axis direction (vertical direction), while the bearing pads 3d function to support the Y stage 4 relative to the surface plate 1 in the Z-axis direction.

The device further includes actuators 42a and 42b for driving the Y stage 4. These actuators have their stationary side portions fixed to the guides 2a and 2b, respectively. Coupling plates 43a and 43b are each provided to couple a movable side portion of an associated one (42a or 42b) of the driving actuators 42a and 42b with an associated one (40a or 40b) of the hydrostatic gas or air bearing mounting plates 40a and 40b. The X stage 5 includes a carrying table 50 upon which a wafer chuck (not shown) may be placed on an occasion when the stage mechanism of the present embodiment is used as an X-Y stage in a step-and-repeat type exposure apparatus (called a "stepper") by which a pattern of a reticle is printed on a semiconductor wafer in a step-and-repeat manner. The mounting plates 51a and 51b of the X stage 5 are provided, as described hereinbefore, for mounting thereon, vertical-direction and lateral-direction bearing members. Denoted at 52 in FIG. 1 is an actuator for driving the X stage 5. The driving actuator 52 has its stationary side portion fixedly secured within a recessed portion 4a (see FIG. 2) of the Y stage 4, and also has its movable side portion fixed to the X stage 5. Denoted at 6 in FIG. 4 are pre-loading magnet units of known type. For example, each magnet unit comprises a magnetic force means having a permanent magnet and yokes provided on the opposite sides thereof. In such a case, when a pressurized fluid is supplied to a hydrostatic bearing means so that a movable member floats therefrom, the magnetic force means can function to prevent an inclination of the movable member due to the variation of the characteristics of the bearing means, to thereby surely retain constant attitude of the movable member.

In this embodiment, each of the driving actuators 42a, 42b and 52 may comprise a linear motor.

As seen from FIGS. 3 and 4, in the present embodiment, in response to supply of gas or air pressure from an unshown hydrostatic gas or air pressure supply source means to the hydrostatic gas or air bearing pads 3c and 3d, the Y stage 4 can float from the surface plate 1 and also can move in the Y direction along the stationary guides 2a and 2b under the influence of the two driving actuators 42a and 42b. On the other hand, in response to supply of gas or air pressure to the hydrostatic gas or air bearing pads 3a and 3b, the X stage 5 can float from the surface plate 1, similar to the case of the Y stage 4, and also can move in the X direction under the influence of the driving actuator 52, while using the side surfaces 41a and 41b of the Y stage 4 as a guide in a transverse direction. At this time, each one of the X stage 5 and the Y stage 4 is controlled by means of the plural preloading magnet units 6 so that it is held in a constant attitude.

Important features of the present embodiment are as follows:

(a) The guide of each one of the X stage 5 and the Y stage 4 in a vertical direction (Z-axis direction) is made by the surface plate 1, such that the movement of one of the X stage 5 and the Y stage 4 does not produce a moving load applied to the other stage. Thus, the static attitude can be retained satisfactorily.

(b) The transmission to the X stage 5 of the vibration of the Y stage 4 with respect to three components, i.e. in a longitudinal direction (X direction in FIG. 1), a perpendicular direction (Z direction in FIG. 1) and rolling (rotation about the Y-axis in FIG. 1), can be completely intercepted.

(c) Any pitching of the Y stage 4 (rotation thereof about the X-axis in FIG. 1) may be transmitted to the X stage 5 only through a hydrostatic gas or air bearing (more specifically, the gas or air discharged from the pad 3a). Therefore, the coupling between the Y stage and the X stage with respect to the pitching of the Y stage is suppressed to a minimum.

(d) The device may be structured so that, when the X stage 5 moves up to an end position in the X-axis direction, the carrying table 50 overhangs a corresponding one of the stationary guides 2a or 2b or a corresponding one of the Y stage driving actuators 42a and 42b. By doing so, the width of the surface plate 1 in the X-axis direction can be reduced with the result that the area to be occupied by the surface plate 1 is kept as small as that in conventional devices.

(e) The height of the movement guiding device, as a whole, including that of the surface plate 1, can be reduced to about one half that of the conventional devices.

(f) By adjusting the height of the coupling plates 43a and 43b relative to the mounting plates 40a and 40b or the movable side portions of the actuators 42a and 42b, it is possible that the point of drive for the Y stage 4 substantially coincides with the center of gravity of the whole X-Y stage mechanism, with respect to the height direction (Z-axis direction). This is very effective to minimize the occurrence of vibration upon the driving of the Y stage.

(g) The width of each hydrostatic gas or air bearing mounting plate 40a or 40b of the Y stage 4, in the Y direction, is made longer than the width of the Y stage 4 in the Y direction. This is effective, because a sufficient area is ensured for the bearing means of the lateral direction (X or Y direction). As a result, the guiding precision of the bearing means increases without enlargement of the Y stage 4. Also, at this time, the length of each hydrostatic gas or air bearing mounting plate 40a and 40b, in the Y-axis direction, is made substantially equal to the length of the movable plate 50 of the X stage 5 in the Y-axis direction. By this, an unpreferable increase in the movable area can be prevented.

Figure 5:
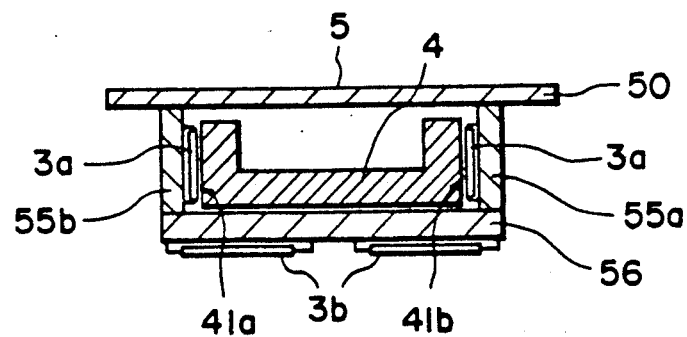
FIG. 5 is a schematic section showing a movement guiding device according to another embodiment of the present invention.
Figure 6:
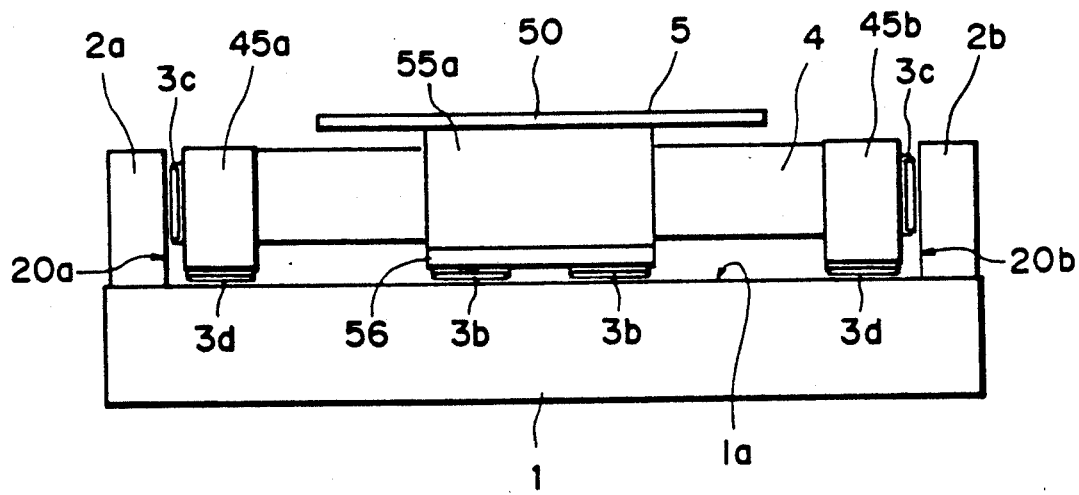
FIG. 6 is a side view showing a general arrangement of the FIG. 5 embodiment.
Figure 7:
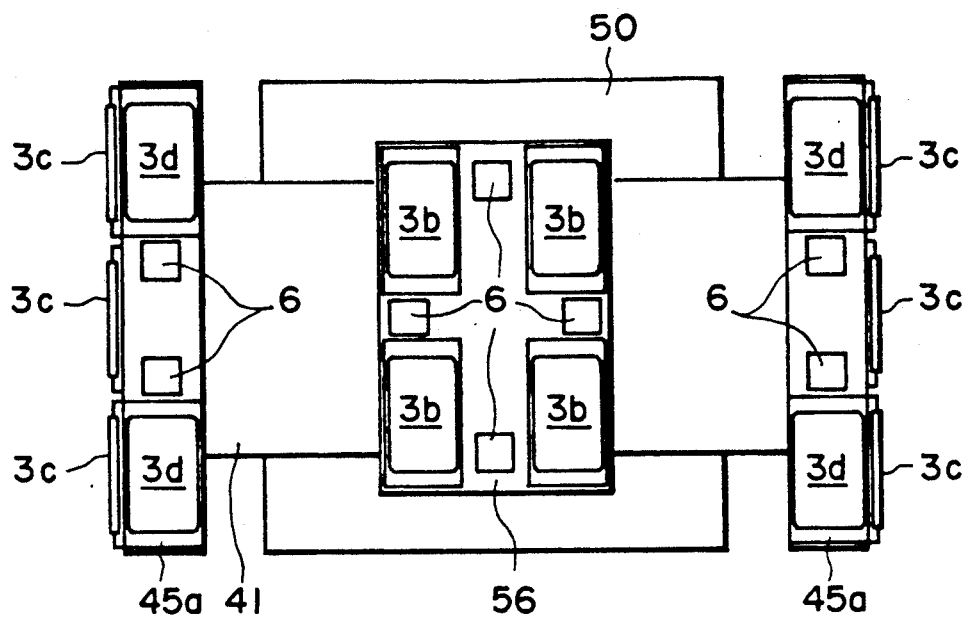
FIG. 7 is a bottom view of a stage mechanism included in the FIG. 5 embodiment.

Referring now to FIGS. 5-7, there is shown another embodiment of the present invention. FIG. 5 is a view similar to FIG. 2 of the foregoing embodiment, and FIGS. 6 and 7 are views similar to FIGS. 3 and 4, respectively.

In this embodiment, those of the elements corresponding to or similar to elements of the foregoing embodiment are assigned with the same reference numerals. Also, the unshown portion of the present embodiment has substantially the same structure as that of the foregoing embodiment.

In FIGS. 5-7 denoted at 45a and 45b are hydrostatic gas or air bearing mounting plates to which vertical-direction and lateral-direction bearing pads 3c and 3d for a Y stage 4 are to be mounted. The mounting plates 45a and 45b are fixedly secured to the opposite ends of the Y stage 4, respectively. Denoted at 56 is a hydrostatic gas or air bearing mounting plate to which vertical-direction bearing pads 3b for an X stage 5 are to be mounted. Denoted at 55a and 55b are hydrostatic gas or air bearing mounting plates to which lateral-direction bearing pads 3a for the X stage 5 are to be mounted. The mounting plate 56 is fixed to the lower surfaces of the mounting plates 55a and 55b such that, as best seen in FIG. 5, they surround the Y stage 4 with the cooperation of a carrying table 50.

In this embodiment, the X stage 5 is provided with the bearing mounting plate 56. This provides various advantages, in addition to the features of the foregoing embodiment, such as, for example, prevention of flexure and deformation of each of the bearing mounting plates 55a and 55b and the carrying table 50 at a time when gas or air pressure are supplied to the bearing pads 3a of the X stage 5. Further, the thickness of each of the carrying table 50 and the bearing mounting plates 55a and 55b can be reduced. Moreover, by suitably setting the thickness of the bearing mounting plate 56, the position of the center of gravity of the X stage 5 can be adjusted. Thus, the point of drive of the actuator 52 to the X stage 5 can be made substantially coincident with the center of gravity of the X stage 5, with respect to the Z-axis direction.

In accordance with the present embodiment, the guide of the X stage and the Y stage in a vertical direction is made by means of the surface plate only. Also, the guide of the Y stage in a lateral direction is made by two stationary guides on the surface plate, while the guide of the X stage in a lateral direction is made by the side surfaces of the Y stage. With this structure, a change in the moving load to the Y stage can be removed. Additionally, transmission to the X stage of the vibration of the Y stage in a vertical direction, X-axis direction and rolling or otherwise is completely intercepted. Furthermore, transmission of any pitching of the Y stage to the X stage is reduced. Thus, the coupling between these stages is minimized. As a consequence, high-precision positioning is attainable.

Figure 8:
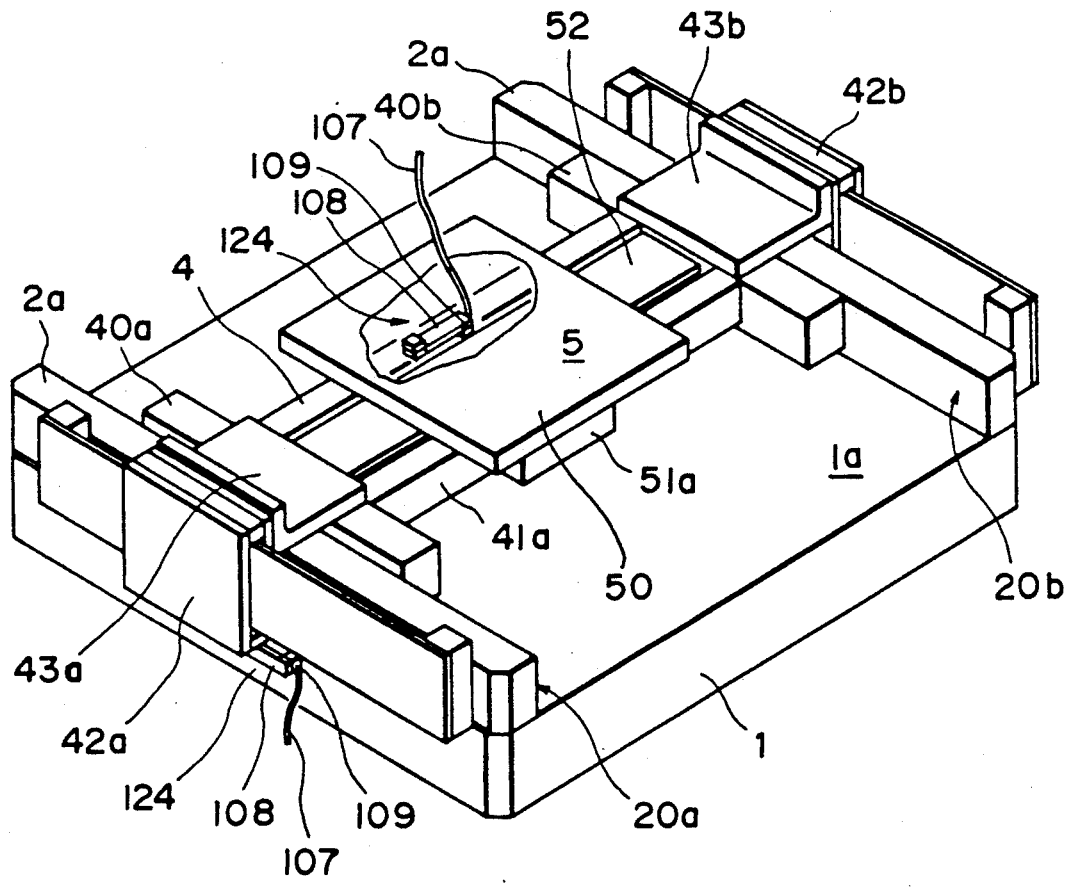
FIG. 8 is a partially broken perspective view showing a movement guiding device according to a further embodiment of the present invention.

FIG. 8 is a perspective view of a movement guiding device according to a further embodiment of the present invention. Like numerals are assigned to similar or corresponding elements. Also, the unshown portion of the present embodiment is of a similar structure as the foregoing embodiment.

As shown in FIG. 8, two parallel Y-direction guides 2a and 2b are fixed to a base (surface plate) 1. Y stage 4 is mounted to these Y-direction guides 2a and 2b with the intervention of a hydrostatic gas or air bearing means (not shown). To this Y stage 4, movable side portions of two Y-drive linear motors 42a and 42b are mounted, such that the Y stage 4 can slide along the Y-direction guides 2a and 2b without contacting thereto. On this Y stage 4, an X stage 5 is mounted with the intervention of another hydrostatic gas or air bearing means (not shown). To the X stage 5, a movable side portion of an X-drive linear motor 52 is mounted, such that the X stage 5 can slide along side surfaces 41a and 41b of the Y stage 4 without contacting thereto. Each one of the X stage 5 and the Y stage 4 is provided with at least one brake unit 124 which may be directly attached to the stage or may be mounted to the movable portion of the linear motor.

Figure 9:
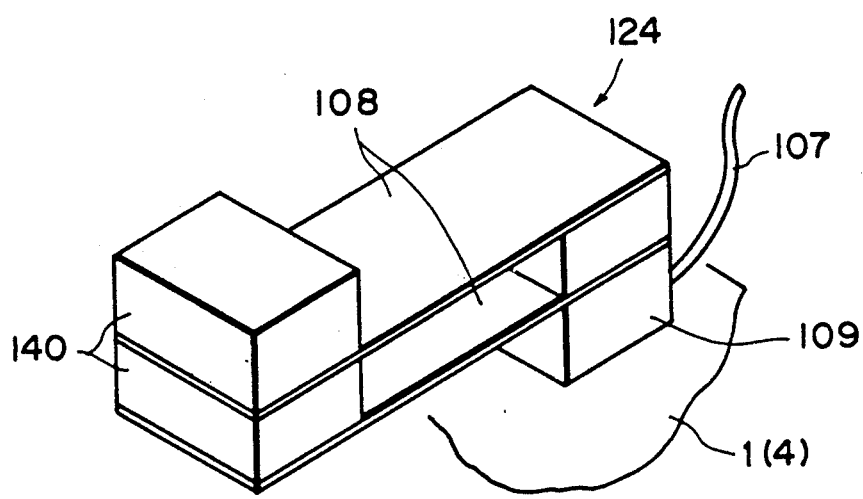
FIG. 9 is an enlarged perspective view which exemplifies a brake unit usable in the FIG. 8 embodiment.

Details of one brake unit 124 are illustrated in FIG. 9. Denoted at 107 is a pressure supply tube which is coupled by way of a switching valve device (not shown) to a high-pressure air source and a vacuum device. There are provided two parallel leaf springs 108, an end of each of which is coupled, as a unit, to the X stage 5 (Y stage 4) by means of mounting blocks 140, as seen in FIG. 8. Denoted at 109 is a slider which is provided at a movable side end portion of the leaf spring 108. While not shown in the drawing, air discharging ports which are in fluid communication with the tube 107 are formed in the bottom surface (sliding surface) of the slider 109. The bottom surface of the slider 109 faces the Y stage 4 (surface plate 1).

Figure 10:
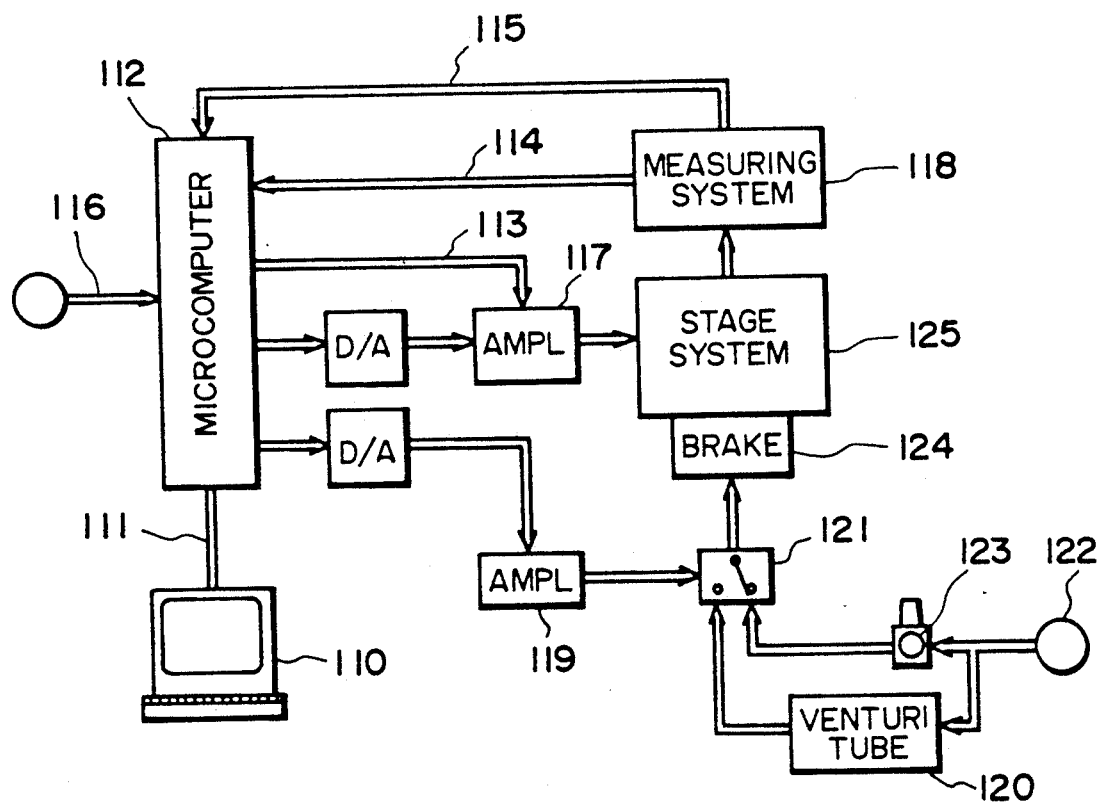
FIG. 10 is a diagram showing a control system of the FIG. 8 embodiment wherein the brake unit shown in FIG. 9 is included.

A control system for the hydrostatically guided stage mechanism of the described structure is illustrated in FIG. 10. Denoted in this Figure at 110 is a controlling computer; at 111, a signal communication line; at 112, a controlling microcomputer; at 113, an output stopping signal; at 114, a table position data line; at 115, a speed-over signal; at 116, an emergency stop signal; at 117, a linear motor driving amplifier; at 118, a laser distance measuring system which includes a laser interferometer; at 119, a solenoid valve actuating amplifier; at 120, a vacuum producing venturi tube; at 121, a solenoid valve; at 122, a high-pressure air source; at 123, a regulator; at 124, a brake unit; and at 125, the entire stage system as shown in FIG. 8.

The operation of the hydrostatically guided stage mechanism and the control system therefor of the structure described above will now be explained.

In normal operation, the stage (table) position of the X-Y stage 125 is read by use of the measuring system 118, and the read value is transmitted to the controlling microcomputer 112 by way of the position data line 114. The microcomputer 112 calculates a difference between the read value and a desired or target position, the calculated difference being applied to the motor driving amplifier 117 as a driving signal by way of a digital-to-analog converter. In response thereto, the linear motors 42a and 42b and/or the linear motor 52 is actuated. On the other hand, through the communication line 111, the operation of the microcomputer 112 is controlled by the primary computer 110, like other components of the stage mechanism. From the high-pressure air source 122, high-pressure air is supplied to the brake unit 124 through the regulator 123 and the solenoid valve 121. On the other hand, because of the resilient deformation of the leaf springs 108, the slider 109 is spaced away from the sliding surface such that no resistance exists.

The measuring system 118 is operable to calculate the moving speed of the table on the basis of the position data. If the detected speed is larger than a predetermined speed, a speed-over signal 115 is produced. When such a speed-over signal 115 or an emergency stop signal 116 is applied from the measuring system 118 to the microcomputer 112, the microcomputer 112 produces an output stopping signal 113 which is applied to the motor driving amplifier 117, whereby the motor is stopped. At the same time, a signal is applied to the solenoid valve actuating amplifier 119 through a digital-to-analog converter, whereby the solenoid valve 121 is connected to the vacuum producing source 120. As a result, the slider 109 contacts the sliding surface to produce resistance by which the stage 4 (5) stops.

With the described structure, during normal movement, no friction resistance exists in the system and, therefore, high-precision positioning as well as high attitude precision are attainable. Additionally, at a time of emergency, such as accidental overrunning of the stage or accidental excess of moving speed thereof, the brake means operates to stop the stage, whereby damage of the stage and/or the hydrostatic bearing means due to collision can be prevented.

Figure 11:
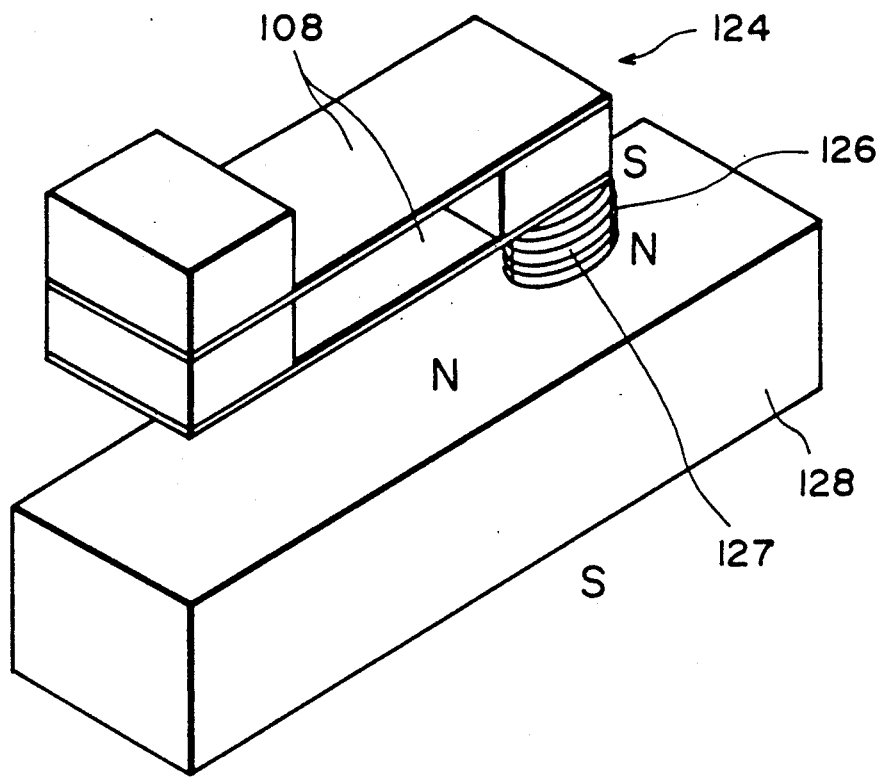
FIG. 11 is an enlarged perspective view showing another example of a brake unit usable in the FIG. 8 embodiment.
Figure 12:
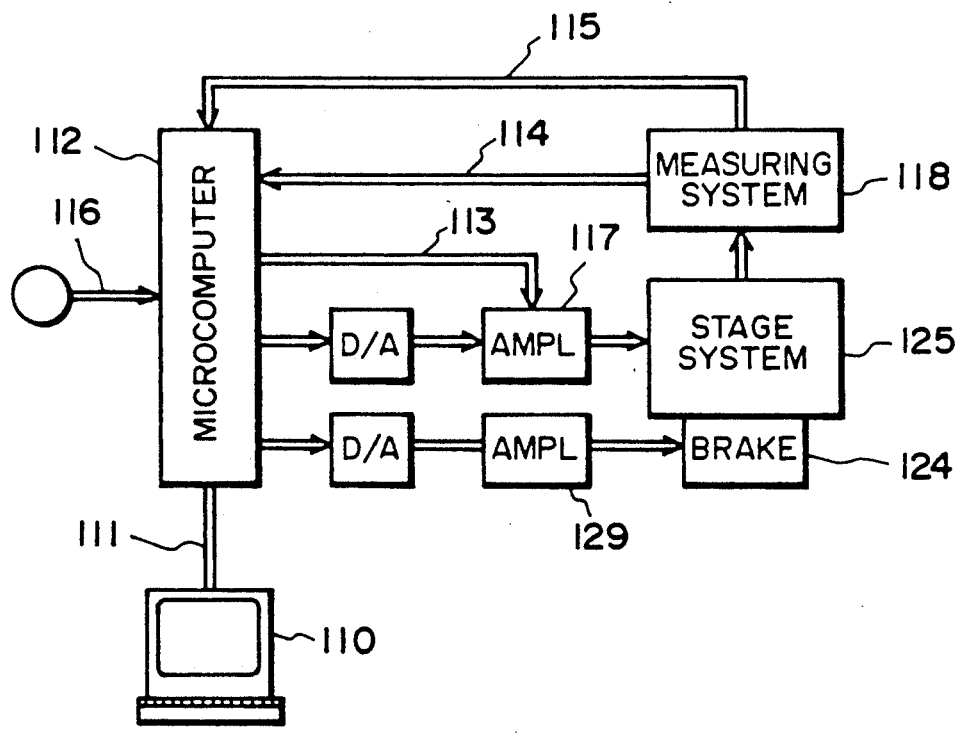
FIG. 12 is a diagram showing a control system of the FIG. 8 embodiment when the brake unit shown in FIG. 11 is used.

FIG. 11 is a perspective view showing another example of a brake unit usable in the present invention. FIG. 12 is a diagram showing a control system usable in a movement guiding device in a case when the brake unit shown in FIG. 11 is used. The brake unit 124, as illustrated, has a structure wherein the slider 109 of the FIG. 9 structure is replaced by a combination of an electromagnet, having a coil 126 and an iron core 127, with a permanent magnet 128. The electromagnet is disposed to be opposed to the permanent magnet 128. The magnet 128 is fixed to the Y stage 4 and the surface plate 1.

Normally, in operation, the coil 126 is electrically energized through an electromagnet driving amplifier 129 so that the permanent magnet 128 and the core 127 are in a repulsing and non-contact state. If a speed-over signal 115 or an emergency stop signal 116 is applied to the microcomputer 112, the coil 126 is deenergized such that the permanent magnet 128 and the core 127 contact to each other to thereby produce resistance.

The remaining structure and function of the present embodiment are similar to those of the embodiments having been described with reference to FIGS. 8-10.

Figure 13:
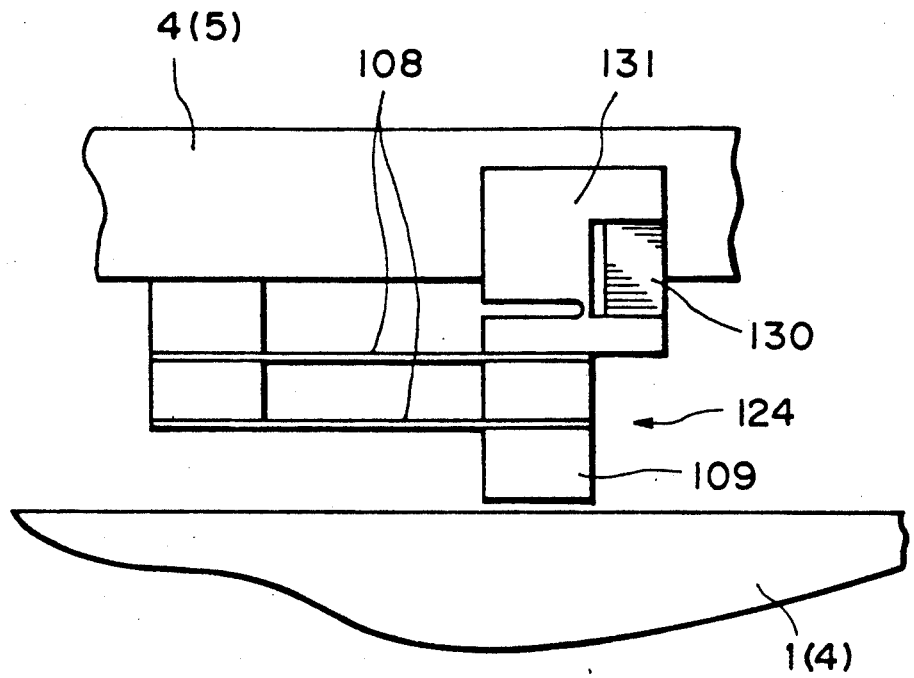
FIG. 13 is a fragmentary side view showing a further example of a brake unit usable in the FIG. 8 embodiment.
Figure 14:
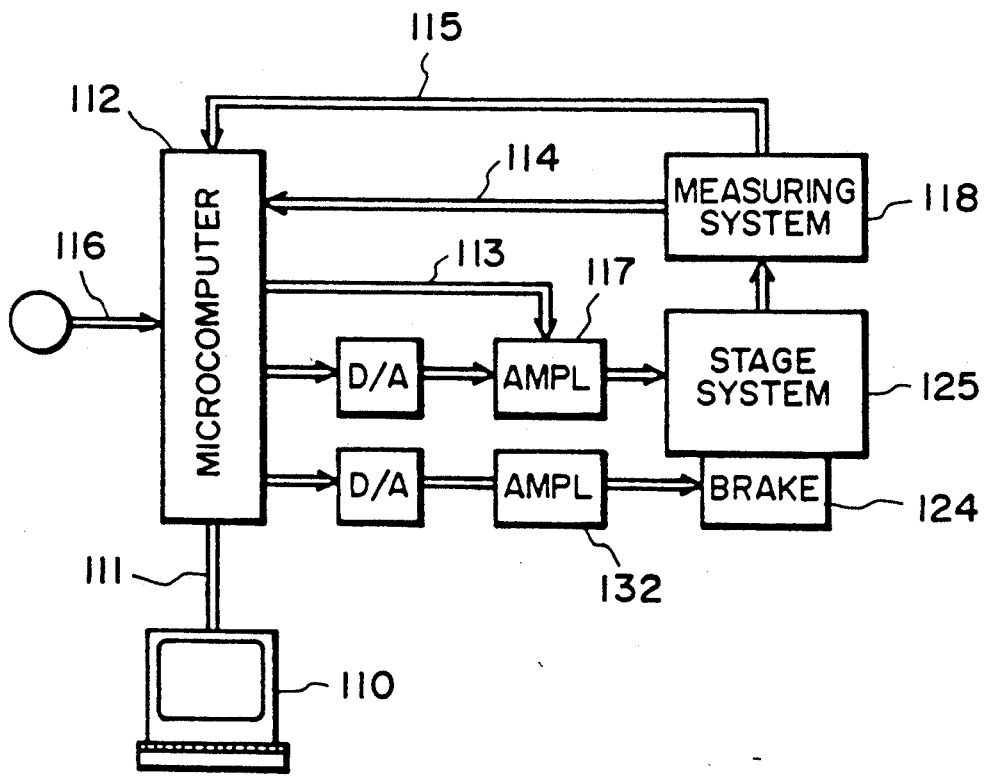
FIG. 14 is a diagram showing a control system of the FIG. 8 embodiment when the brake unit shown in FIG. 13 is incorporated thereinto.
Figure 15:
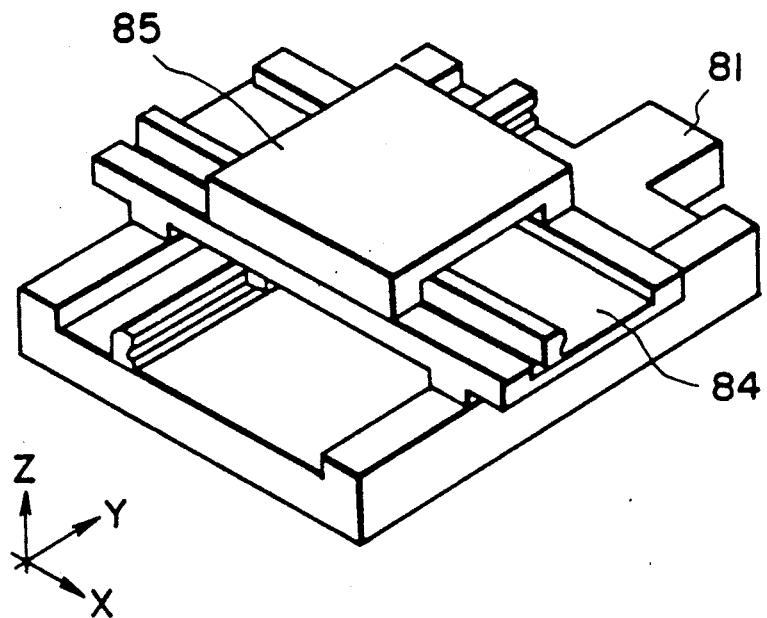
FIG. 15 is a perspective view showing a known type movement guiding device.
Figure 16:
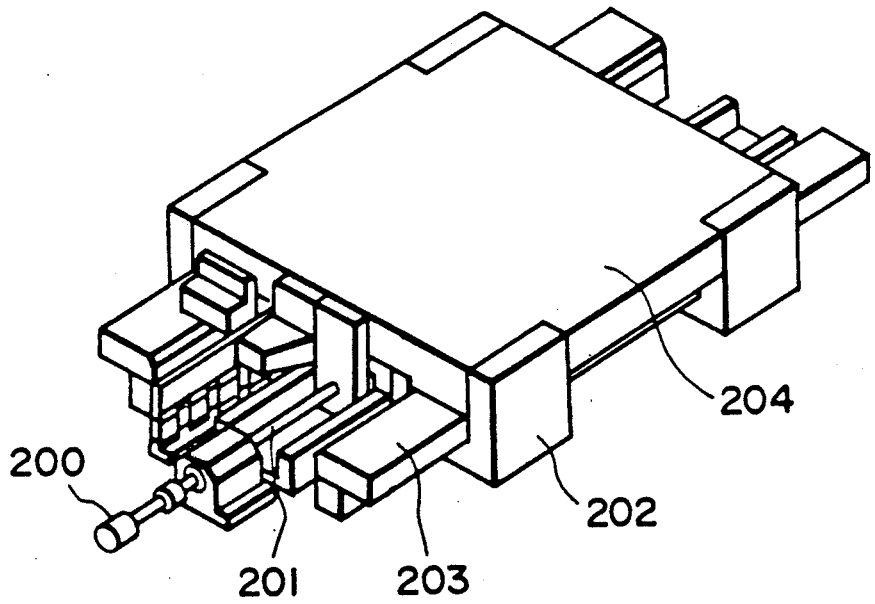
FIG. 16 is a perspective view showing an example of a known type hydrostatically guided stage mechanism.
Figure 17A:
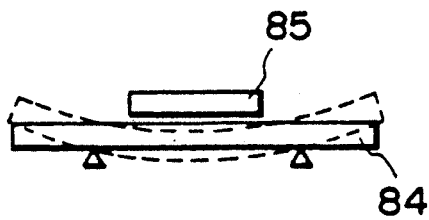
FIGS. 17A and 17B are schematic views, respectively, for explaining deformation of a stage in the movement guiding device of the FIG. 15 example.
Figure 17B:
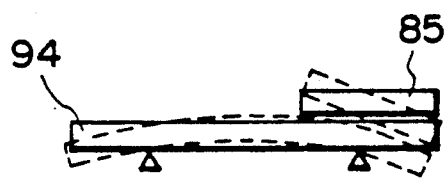
Figure 18:
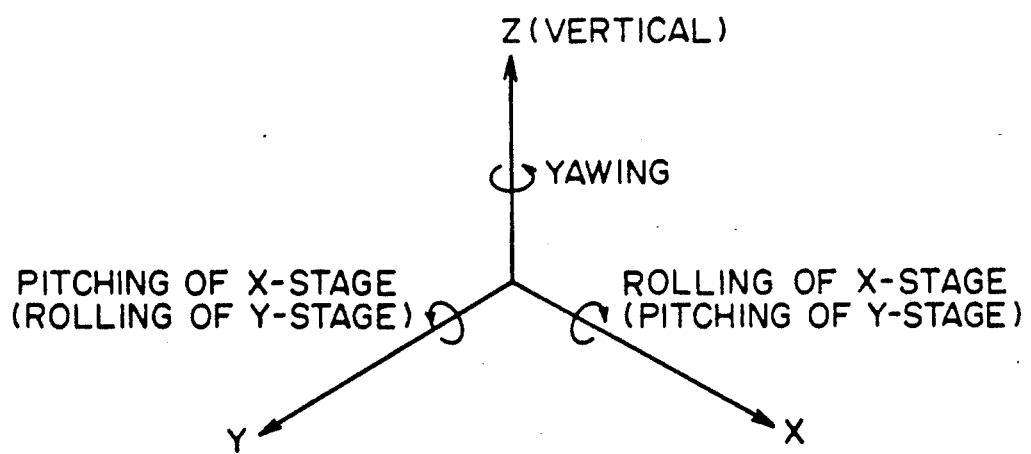
FIG. 18 is a representation explaining vibration modes.

FIG. 13 is a schematic view showing a further example of a brake unit usable in the present invention. FIG. 14 is a diagram showing a control system of a movement guiding device wherein the brake unit of the FIG. 13 example is used. The brake unit 124 of the FIG. 13 example has a structure that a slider 109 is provided at a free end of a leaf spring 108 and that a piezoelectric device 130 is mounted through a displacement transmitting mechanism 131 which is fixed integrally to a stage 4 (5).

Normally, in operation, the piezoelectric device 130 is electrically energized through a driving amplifier 132 so that the piezoelectric device 130 displaces to bring the slider 109 and the sliding surface into a non-contact state. If, however, a speed-over signal 115 or an emergency stop signal 116 is produced, the piezoelectric device 130 is deenergized such that, by means of the displacement transmitting mechanism 131, the slider 109 contacts the sliding surface.

The remaining structure and function of the present embodiment is similar to the embodiments having been described with reference to FIGS. 8-10.

When any one form of the brake units shown in FIGS. 11-13 is used, when the voltage supply stops due to an accident or otherwise, there is produced a resistance which provides a braking action. Therefore, damage of the stage and/or the hydrostatic bearing means can be prevented.

In accordance with the present invention, as has hitherto been described, linear motors are used as actuator means for an X-Y stage which is guided hydrostatically, such that all the movable portions are provided by a non-contact structure. Also, a controllable brake means is added to the stage. Thus, during normal movement control, resistance can be removed with a result of attainment of higher precision in the positioning attitude. Also, because no resistance exists during movement, high-speed movement is attainable. Further, the brake means can operate at a time of an accident of the stage, so that collision of the stage, derailment of the stage from its guide, or otherwise, can be avoided. Therefore, it is possible to prevent damage of the stage and/or the hydrostatic bearing means.

While the invention has been described with reference to the structures disclosed herein, it is not confined to the details set forth and this application is intended to cover such modifications or changes as may come within the purposes of the improvements or the scope of the following claims.

What is claimed is:

1. A movement guiding device, comprising:
a surface plate;
two stationary guides fixed on said surface plate;
a first movable member mounted on said surface plate in an internal space between said stationary guides;
a second movable member mounted on said surface plate so as to straddle said first movable member;
a first drive source for moving said first movable member in a first direction relative to said surface plate;
a second drive source for moving said second movable member, relative to said first movable member, in a second direction perpendicular to the first direction;
first bearing means comprising a first pad disposed between said first movable member and said surface plate and a second pad disposed between said first movable member and said stationary guides, said first bearing means further comprising means for discharging gas from each of said first and second pads for supporting said first movable member relative to said surface plate in a direction perpendicular to said surface plate, and for guiding said first movable member in the first direction relative to said stationary guides; and
second bearing means comprising a third pad disposed between said second movable member and said surface plate and a fourth pad disposed between said second movable member and said first movable member, said second bearing means comprising means for discharging gas from each of said third and fourth pads for supporting said second movable member relative to said surface plate in the direction perpendicular to said surface plate and for guiding said second movable member in the second direction relative to said first movable member.

2. A device according to claim 1, wherein said first drive source acts on said first movable member at a perpendicular distance away from said surface plate substantially equal to a perpendicular distance of a center of gravity for the combined first and second movable members away from said surface plate.

3. A device according to claim 1, wherein said first drive source comprises two linear motors having movable portions integrally coupled to opposite ends of said first movable member and stationary portions integrally coupled to said surface plate at positions external to the internal space between said stationary guides.

4. A device according to claim 1, wherein said second drive source comprises a linear motor having a movable portion integrally coupled to said second movable member and a stationary portion integrally coupled to said first movable member.

5. A device according to claim 4, wherein said first movable member comprises a recessed portion and the stationary portion of said linear motor is mounted within the recessed portion.

6. A device according to claim 4, wherein said first drive source comprises two linearly motors having movable portions integrally coupled to opposite ends of said first movable member and stationary portions integrally coupled to said surface plate at positions external to the internal space between said stationary guides.

7. A device according to claim 1, wherein said second movable member comprises a table and two first mounting plates integrally coupled to said table for locating said first movable member therebetween and having said first, second, third, and fourth pads fixed to said first mounting plates to surround said first movable member with the cooperation of said table and having said third pad mounted thereto.

8. A movement guiding device, comprising:
a horizontally oriented base including a guide;
a first movable member comprising first and second pads, each of said first and second pads comprising means for discharging gas, said first pad further comprising means for supporting said first movable member in a vertical direction on said base on a cushion of the gas discharged therefrom, and said second pad further comprising means for guiding said first movable member along said guide in a first direction, different from the vertical direction, on a cushion of the gas discharged therefrom;

a second movable member comprising third and fourth pads, each of said third and fourth pads comprising means for discharging gas, said third pad further comprising means for supporting said second movable member on said base in the vertical direction on a cushion of the gas discharged therefrom and said fourth pad further comprising means for guiding said second movable member along said first movable member in a second direction, different from the vertical and the first directions;

a first drive source for moving said first and second movable members as a unit, relative to said base, in the first direction; and a second drive source for moving said second movable member relative to said first movable member, in the second direction.

9. A device according to claim 8, wherein said first drive source comprises a linear motor having a movable portion integrally coupled to said first movable member and a stationary portion integrally coupled to said base.

10. A device according to claim 8, wherein said second drive source comprises a linear motor having a movable portion integrally coupled to said second movable member and a stationary portion integrally coupled to said first movable member.

11. A device according to claim 8, wherein each of said first and second drive sources comprises a linear motor.

12. A movement guiding device, comprising:

first and second movable members;

a base for supporting each of said first and second movable members independently of each other in a vertical direction by static pressure gas, said base comprising a guide for guiding movement of said first movable member in a first direction, different from the vertical direction, by static pressure gas;

said first movable member comprising means for guiding movement of said second movable member in a second direction, different from the vertical and the first directions, by static pressure gas;

a first linear motor for moving said first and second movable members as a unit, relative to said base, in the first direction; and a second linear motor for moving said second movable member relative to said first movable member, in the second direction.

* * * * *

UNITED STATES PATENT AND TRADEMARK OFFICE
CERTIFICATE OF CORRECTION

PATENT NO. : 5,040,431
DATED : August 20, 1991
INVENTOR(S) : Shigeo Sakino It is certified that error appears in the above-identified patent and that said Letters Patent is hereby corrected as shown below:

COLUMN 2

Line 51, "to damage of" should read --of damage to--.

COLUMN 9

Line 26, "is" should read --are--.

COLUMN 10

Line 48, "linearly motors" should read --linear motors--.

Signed and Sealed this

Ninth Day of March, 1993

Attest:

STEPHEN G. KUNIN

Attesting Officer

Acting Commissioner of Patents and Trademarks